(12) United States Patent
Powell

(10) Patent No.: US 6,786,935 B1
(45) Date of Patent: Sep. 7, 2004

(54) VACUUM PROCESSING SYSTEM FOR PRODUCING COMPONENTS

(75) Inventor: Earl G. Powell, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/523,366

(22) Filed: Mar. 10, 2000

(51) Int. Cl.[7] .......................... H01L 21/00; C23C 16/00
(52) U.S. Cl. .................. 29/25.01; 118/715; 156/345.31
(58) Field of Search ..................... 29/25.01; 156/345; 118/719

(56) References Cited

U.S. PATENT DOCUMENTS

| | | | |
|---|---|---|---|
| 4,094,722 A | * | 6/1978 | Yamamoto et al. ......... 156/345 |
| 4,330,381 A | | 5/1982 | Jumer |
| 4,455,177 A | | 6/1984 | Filippov et al. |
| 4,632,624 A | | 12/1986 | Mirkovich et al. |
| 4,790,750 A | | 12/1988 | Bourel et al. |
| 5,085,887 A | | 2/1992 | Adams et al. |
| 5,292,393 A | * | 3/1994 | Maydan et al. ........ 156/345.32 |
| 5,419,924 A | | 5/1995 | Nagashima et al. |
| 5,421,957 A | | 6/1995 | Carlson et al. |
| 5,586,585 A | * | 12/1996 | Bonora et al. ................ 141/93 |
| 5,758,532 A | | 6/1998 | Massee |
| 5,775,151 A | | 7/1998 | Massee |
| 5,858,198 A | | 1/1999 | Florio et al. |
| 5,861,086 A | | 1/1999 | Khurana et al. |
| 5,873,992 A | | 2/1999 | Glezen et al. |
| 5,882,411 A | | 3/1999 | Zhao et al. |
| 5,902,650 A | | 5/1999 | Feng et al. |
| 5,904,800 A | * | 5/1999 | Mautz ......................... 156/345 |
| 5,927,120 A | | 7/1999 | Marando |
| 5,932,167 A | | 8/1999 | Fritz et al. |
| 5,976,310 A | | 11/1999 | Levy |
| 5,980,686 A | | 11/1999 | Goto |
| 5,992,660 A | | 11/1999 | Miura et al. |
| 6,000,227 A | | 12/1999 | Kroeker |
| 6,019,839 A | | 2/2000 | Achutharaman et al. |
| 6,040,585 A | * | 3/2000 | Hsiao ....................... 250/559.4 |
| 6,093,252 A | | 7/2000 | Wengert et al. |
| 6,099,697 A | | 8/2000 | Hausmann |
| 6,179,955 B1 | * | 1/2001 | Shin et al. ................... 156/345 |
| 6,286,451 B1 | | 9/2001 | Ishikawa et al. |
| 6,326,597 B1 | | 12/2001 | Lubomirsky et al. |
| 6,383,330 B1 | | 5/2002 | Raaijmakers |
| 6,390,019 B1 | | 5/2002 | Grimbergen et al. |

FOREIGN PATENT DOCUMENTS

| | | |
|---|---|---|
| EP | 0 928 014 A2 | 7/1999 |
| EP | 1 065 701 A2 | 1/2001 |

* cited by examiner

*Primary Examiner*—Richard A. Booth
(74) *Attorney, Agent, or Firm*—Dugan & Dugan

(57) ABSTRACT

The present invention provides a vacuum processing system for creating processed substrates having a domed lid on at least the transfer chamber. The lid may be provided either convex to the chamber, thus decreasing the volume of the chamber and the amount of microparticulate matter present in the chamber, or concave to the chamber. The invention also provides features to enhance the use of the domed lid, e.g., structural features that decrease lifting of the edges of the lid upon introduction of a vacuum to the chamber.

14 Claims, 5 Drawing Sheets

VACUUM PROCESSING SYSTEM FOR PRODUCING COMPONENTS

FIELD OF THE INVENTION

This invention generally relates to vacuum processing systems. Specifically, this invention relates to methods and apparatuses for manufacturing components using a vacuum processing system having an improved transfer chamber.

BACKGROUND OF THE INVENTION

A number of benefits can be obtained by manufacturing certain functional components within a vacuum environment. In view of these advantages, vacuum processing systems for the processing of various substrates have been developed. Typically, a vacuum processing system has a centralized transfer chamber mounted on a monolith platform. The transfer chamber is the center of activity for the movement of the substrate being processed in the system. Substrates are generally in the transfer chamber only long enough to be transferred to another chamber for storing or processing. One or more process chambers attach to the transfer chamber at valves through which substrates are passed by a robot in the transfer chamber. The valves close in order to isolate the process chambers while substrates are being processed therein.

Physically, the process chambers are either supported by the transfer chamber and its platform or are supported on their own platform. Inside the system, the transfer chamber is typically held at a constant vacuum, whereas, the process chambers may be pumped to a greater vacuum for performing their respective processes. Following processing, the pressure of the process chamber must be returned to the level in the transfer chamber before opening the valve to permit access between the chambers.

Access to the transfer chamber for substrates from the exterior of the system, or from the manufacturing facility, is typically through one or more load lock chambers. The load lock chambers cycle between the pressure level of the ambient environment and the pressure level in the transfer chamber in order for the substrates to be passed, so the load lock chambers transition the substrates between the atmospheric pressure of a very clean environment to the vacuum of the transfer chamber.

Some common transfer chambers have facets for four to six process chambers and load lock chambers. For a six-faceted transfer chamber, typically two of the facets are for load lock chambers, and the other four facets are for process chambers. The process chambers include rapid thermal processing (RTP) chambers, physical vapor deposition (PVD) chambers, chemical vapor deposition (CVD) chambers, etch chambers, etc. The productivity of a vacuum processing system is increased when more process chambers are mounted to the transfer chamber, because more substrates can be processed at a given time. Additionally, less space is required in the manufacturing facility if the productivity of the system is maximized. Thus, there is a need for larger transfer chamber to allow the mounting of a greater number of process chambers.

In addition, certain substrates to be processed are very large, and thus require a large transfer chamber to allow processing of the substrate. For example, glass plates of certain flat-panel plasma displays are processed using thin-film techniques to deposit horizontal electrodes and vertical column electrodes onto the glass. Since it is desirable to process very large plates of glass for this purpose, a very large transfer chamber is necessary to manipulate the glass substrate for transfer to a processing unit.

It is desirable to keep the volume of the larger transfer chamber to a minimum in order to decrease manufacturing costs, increase efficiency of the chamber, and to reduce the effects of contamination due to microparticulate matter within the chamber. There is thus a need in the art for a vacuum processing system with improved capacity and efficiency for high throughput production of processed substrates.

SUMMARY OF THE INVENTION

The present invention features a vacuum processing system having a domed lid on at least the transfer chamber of the system. This domed lid can be used with any vacuum processing system that utilizes a circular lid to form an airtight seal between the edge of the lid and the corresponding edge of the chamber. Moreover, a single domed lid can be designed for attachment in either a convex or a concave configuration, allowing the user to change configuration if desired for different processing protocols.

The lid of the invention is more cost effective and can be of greater diameter than conventional transfer chamber lids due to the decreased weight of the domed lid compared to conventional, flat lids. These lids may be in any desired size range, and preferably are in a size range up to about 100 inches in diameter. The domed lid can be constructed using any number of methods known in the art such as hydroforming, electroplating, and the like. In a preferred embodiment, the lid is produced through spinning a metal, and in particular spinning stainless steel.

In a preferred embodiment, the lid is comprised of one or more windows or access features to allow a user or a diagnostic device to view the substrate in the chamber during the manufacturing process, e.g., to monitor positioning of the substrate prior to entrance into a processing chamber. A window for visualization of the substrate may be a side window, i.e. a window that runs circumferentially at the edge of the transfer chamber lid, or a window in the dome portion of the lid.

It is thus a feature of the invention that the domed transfer chamber lid may be provided with windows or other means for visualization of the substrate.

A single manufactured lid can be provided either convex or concave to the chamber, thus providing flexibility to the user to alter the configuration of the lid. This is enabled in part by a structural feature that functions to prevent lifting of the lid from the o-ring at the lid attachment site upon introduction of the vacuum to the transfer chamber. In one exemplary embodiment, the structural feature involves the placement of the o-ring relative to the domed lid, i.e. an o-ring further from the edge to better prevent the lifting of the edge of the transfer chamber lid. In a preferred embodiment, a structural feature in the lid itself that absorbs distortion, such as an "S" transition as described herein, is added to the structure of the chamber lid to prevent lifting during use. This allows the user to change configuration of the lid depending on the needs of the vacuum processing chamber for different purposes. This flexibility of placement of the domed lid applies to lids with or without a side window.

It is thus another feature of the invention that the domed transfer chamber lid may be attached in either the convex or the concave configuration.

It is an advantage of the present invention that the domed lid can be manufactured using a number of techniques including but not limited to spinning, hydroforming, electroplating, and the like.

It is yet a further advantage of the invention that a single domed lid may be used in either configuration.

It is a further advantage of the invention that the configurations of the domed transfer chamber lid convex to the chamber can decrease the volume of the transfer chamber. Decreased volume can decrease the manufacturing costs as well as decreasing microcontamination.

It is yet a further advantage of the invention that the domed transfer chamber may be greater in diameter than conventional transfer chamber lids, thus providing the capability of processing larger substrates and/or more substrates simultaneously.

It is yet another advantage of the invention that a structural feature that absorbs distortion may be added to prevent lifting of the lid due to vacuum pressure.

These and other objects, advantages, and features of the invention will become apparent to those persons skilled in the art upon reading the details of the vacuum processing system as more fully described below.

BRIEF DESCRIPTION OF THE DRAWINGS

The described features, advantages and objects of the present invention are attained and can be understood in detail are illustrated by the embodiments illustrated in the appended drawings. It is to be noted, however, that the appended drawings illustrate only typical embodiments of this invention and are therefore not to be considered limiting of its scope, for the invention is intended to encompass other equally effective embodiments.

DETAILED DESCRIPTION OF PREFERRED EMBODIMENTS

Figure 1:
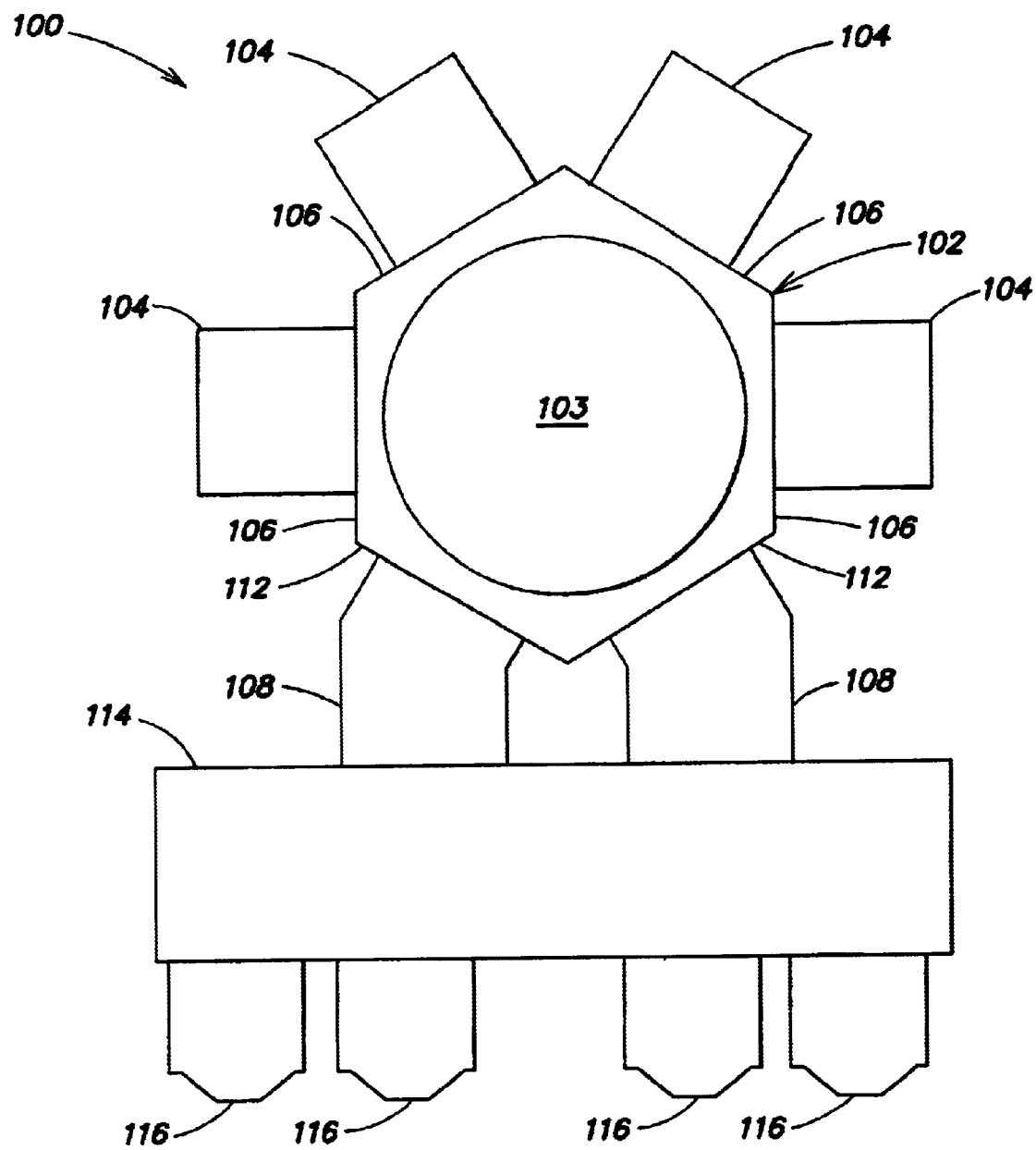
FIG. 1 is a top view of a schematic of an exemplary vacuum processing system incorporating the present invention.

Before the present embodiments are described, it is to be understood that this invention is not limited to particular materials, substrates, etc. described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictate otherwise. Thus, for example, reference to "a substrate" includes a plurality of such substrates and reference to "the metal" includes reference to one or more metals and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Although the invention as described herein focuses on use of a domed lid for a transfer chamber, it will be apparent to one skilled in the art upon reading the present disclosure that the same principles may apply to the lid of other components of a vacuum processing system, e.g., a process chamber or a load lock chamber. It is thus to be understood that the present invention is intended to encompass the use of such a domed lid in components of the vacuum system other than the transfer chamber.

Definitions

The term "substrate" as used herein refers to any material that is to be processed in the process chambers of the vacuum processing system. Such substrates include, but are not limited to, silicon; glass, such as aluminosilicate glass, barium aluminosilicate glass, etc.; ceramics; and metals, such as copper, aluminum and silver.

The terms "convex", "convex attachment" and the like as used herein refer to a placement of the domed transfer chamber lid in which the center of the domed lid is closer to the floor of the transfer chamber than the surrounding edge.

The terms "concave", "concave attachment" and the like as used herein refer to a placement of the domed transfer chamber lid in which the center of the domed lid is further from the floor of the transfer chamber than the surrounding edge of the lid.

The term "structural feature" as used herein refers to any alteration made to the basic domed structure of the transfer chamber lid, either during or after production, that will allow the lid to adjust to forces during use of the transfer chamber, i.e. forces exerted on the lid from the vacuum within the transfer chamber. Such a structural feature may be a structural variation introduced into the domed lid, e.g. an "S" shaped transition near the attachment site of the lid. Other structural variations that may be used will be apparent to one skilled in the art upon reading the present disclosure.

The phrase "within the domed portion" as used herein refers to the placement of any feature of the lid, for example a window, diagnostic device, or a processing device, where the feature is integrated within the rounded portion of the transfer chamber lid physically above the transfer chamber.

Structural Aspects of the Invention

An electro-polished stainless steel spun dome is disclosed which serves as a cover for a chamber in which components (e.g. silicon wafers or glass surfaces) are transferred and/or processed under vacuum conditions. The dome can be attached to the chamber in at least two different configurations, each of which allows access to the chamber by robotics which carry out the manufacturing. In a first configuration, the dome includes a window and is attached to the container in a convex manner, i.e. with the curve of the dome protruding toward the chamber. The dome may also be connected in a convex manner without a window, which eliminates visibility of the substrate in the chamber but which further reduces the volume of the chamber. In a second configuration, the curve of the dome is connected in a concave manner, i.e. with the curve protruding away from the container. The convex position in particular allows for a decrease in, the volume of the chamber and the amount of microparticulate matter present in the chamber.

FIG. 1 illustrates a schematic top view of an exemplary vacuum processing system 100 incorporating the present invention. This system 100 is of the cluster type of systems that are typically used for manufacturing processed substrates in a vacuum such as integrated circuits on wafers. The vacuum processing system 100 includes a transfer chamber 102 typically mounted on a platform (not shown). The transfer chamber 102 has a lid 103 mounted on its top. When it is attached, the lid 103 forms an airtight seal with the transfer chamber 102, so that when the pressure in the transfer chamber is reduced to a vacuum, air does not leak into the transfer chamber 102. The transfer chamber 102 has process chambers 104 attached at facets 106. Process chambers 104 may be any type of process chamber, such as a physical vapor deposition chamber, a chemical vapor deposition chamber, an etch chamber, etc. It is not uncommon for a manufacturer of process chambers to provide over twenty different types of process chambers. The process chambers 104 may be supported by the transfer chamber 102 or may be supported on their own platforms depending on the configuration of the individual process chambers 104. Slit valves (not shown) in the facets 106 provide access and isolation between the transfer chamber 102 and the process chambers 104. Correspondingly, the process chambers 104 have openings (not shown) on their surfaces that align with the slit valves. The transfer chamber 102 also has load lock chambers 108 mounted at facets 12. Openings (not shown) in the facets 112 provide access and isolation between the load lock chambers 108 and the transfer chamber 102. Correspondingly, the load lock chambers 108 have openings on their surfaces that align with the openings in facets 112.

The load lock chambers 108 are attached to a mini-environment 114. The load lock chambers 108 and the mini-environment 114 have corresponding openings (not shown) providing access between load lock chambers and the mini-environment, while doors (not shown) for the openings provide isolation. The mini-environment 114 has pod loaders 116 attached on its front side. Openings (not shown) with corresponding doors (not shown) provide access and isolation between the mini-environment 114 and the pod loaders 116.

In operation, the substrates to be processed in the system 100 are placed on the top of the pod loaders 116. Then a robot (not shown) begins removing the substrates, one at a time, out of the pod loaders and into one of the load lock chambers 108. After the substrates have been loaded into the load lock chamber 108, the pressure is the load lock chamber is reduced to match that in the transfer chamber 102. Then the door on the transfer chamber side is opened, and the transfer chamber robot (not shown) can begin servicing the load lock chamber 108. The transfer chamber robot moves the substrates from the load lock chamber 108 to one of the process chambers 104 for processing, and afterwards moves the substrates back to one of the load lock chambers 108. When the load lock chamber 108 has received all of the processed substrates, the pressure in the load lock chamber is returned to that of the mini-environment, so the robot within the mini-environment can move the processed substrates back to a substrate pod 116.

The domed lid of the invention can be used in place of most conventional circular chamber lids, providing equivalent functionality while decreasing the volume and/or cost of production of the transfer chamber. For ease of description, the different configurations of the transfer chamber lid on the vacuum processing system are illustrated herein only with respect to the transfer chamber, not the entire vacuum processing system. One skilled in the art will be able to adapt the concepts illustrated with the transfer chamber for use in any number of vacuum processing systems, as will be apparent upon reading the present disclosure.

Figure 2:
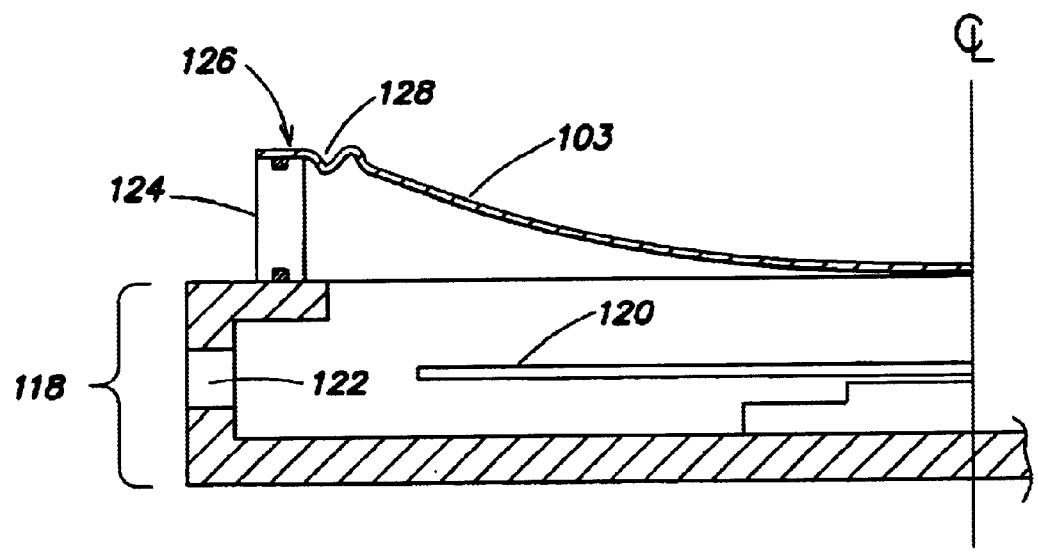
FIG. 2 is a side view of one embodiment of the domed transfer chamber lid having an attachment convex to the vacuum and a window.
Figure 3:
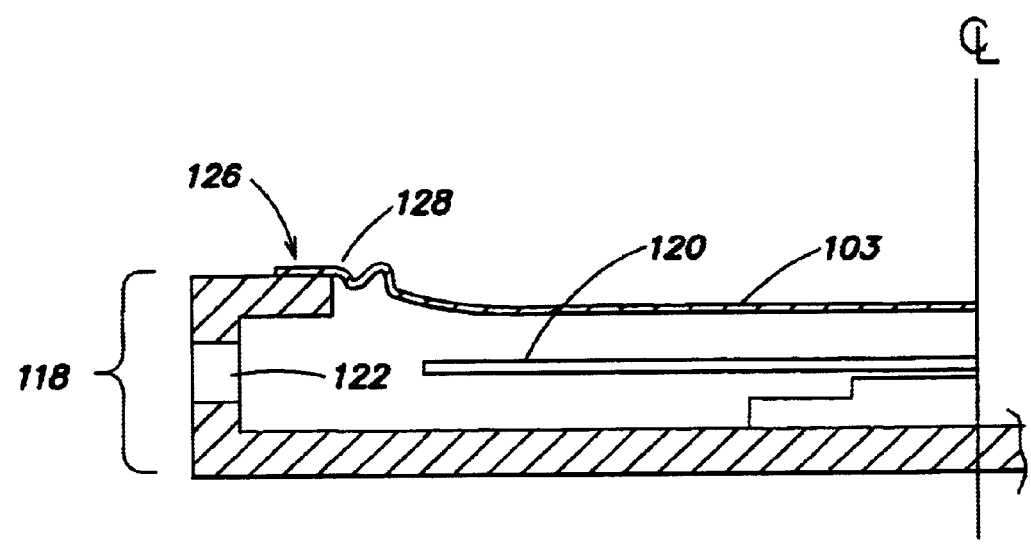
FIG. 3 is a side view of another embodiment of the domed transfer chamber lid having an attachment convex to the vacuum with no window.

FIGS. 2 and 3 illustrates side views of the domed lid 103 of the invention having a convex attachment to the transfer chamber 118. The domed lid 103 is placed on the transfer chamber 118 in a manner that allows access to the vacuum robot and effector blade 120 as well as to the slit valve through a door opening 122, but reduces the volume of the transfer chamber 118 as compared with conventional flat transfer chamber lids. This increases the efficiency of the vacuum processing system and reduces the possibility of contamination of the substrate by reducing exposure to microparticulate contamination. The volume of the transfer chamber 118 added by the transfer chamber lid 103 is decreased by 50% relative to the volume added by a conventional, flat lid of the same diameter.

FIG. 2 illustrates an embodiment of the invention whereby the transfer chamber lid is convexly attached domed transfer chamber lid, the lid having a side window 124 around the circumference of the lid to allow a user to view the substrate within the transfer chamber. Although the lid 103 is convex to the transfer chamber 118, and thus will be lower in the center than at the attachment site 126, the diagonal line of sight of the user should still allow full view of the substrate, particularly since the window 124 is circumferential to the substrate. Thus, this placement of the domed lid 103 provides the same level of visual access as the conventional flat plate transfer cover with a side window 124.

FIG. 3 is a side view of a domed transfer chamber lid 103 having a placement convex to the vacuum with no window.

This embodiment results in a decreased volume compared with that illustrated in FIG. 2, and thus may be preferable for certain uses, such as the processing of very large substrates.

Figure 4:
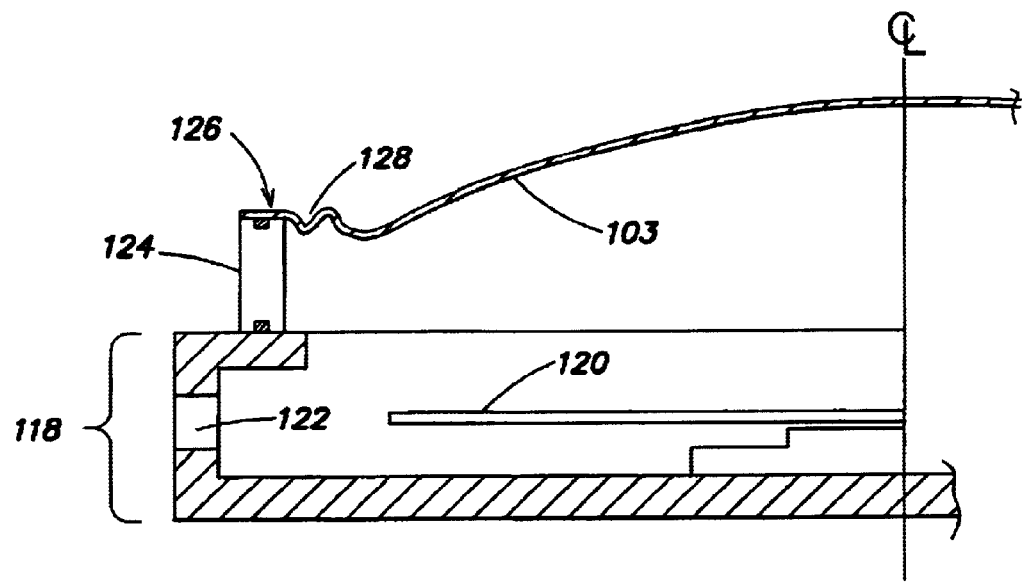
FIG. 4 is a side view of another embodiment of the domed transfer chamber lid having an attachment concave to the vacuum and a window.
Figure 5:
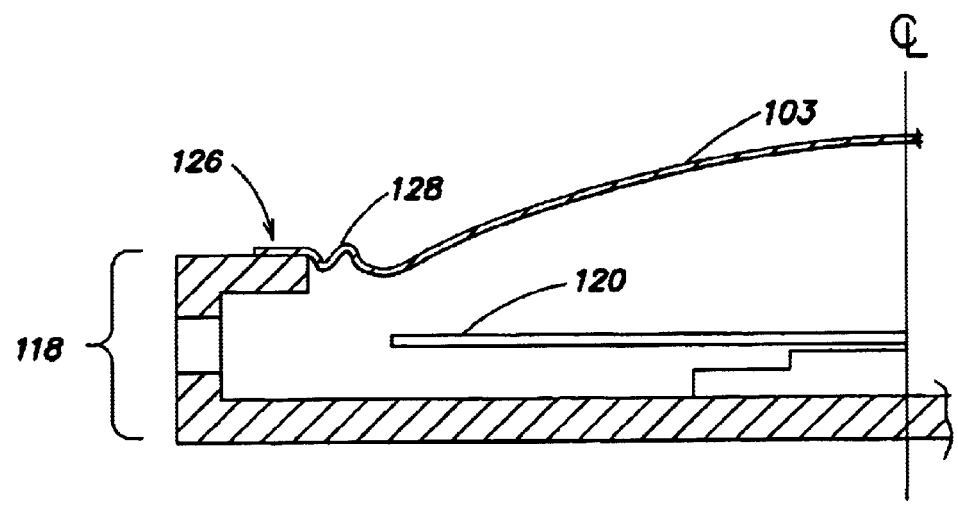
FIG. 5 is a side view of another embodiment of the domed transfer chamber lid having an attachment concave to the vacuum with no window.

FIGS. 4 and 5 show a side view of a domed transfer chamber lid 103 having an attachment concave to the transfer chamber 118, with and without a window 124, respectively. This embodiment does not inherently decrease the volume of the transfer chamber 118, as the convex attachment does, but it allows for more space within the top of the transfer chamber 118. Thus, if it is desirable to attach a diagnostic or processing mechanism internally at the center of the transfer chamber lid 118, this placement would allow for extra space at the center without requiring extra space at the sides as would a conventional, flat transfer chamber lid. Thus, this embodiment would allow for more room internally at the center of the chamber without requiring extension of the height to the side attachment site of the lid.

The domed lid of the invention is preferably provided on the transfer chamber in a manner that minimizes the movement of the transfer chamber lid in response to the stresses of use, e.g., the tendency of the flange to lift off the o-ring (not shown) when a plate is loaded. The feature that reduces the response to stress can be a structural feature that is part of the lid itself, a modification of the placement of the lid (e.g., placement of the o-ring seal of the attachment site 126 closer to the chamber) or a combination thereof. In a preferred embodiment, the domed lid of the invention is constructed to possess a structural feature 128 in the dome itself with the ability to absorb the additional stress to the domed lid during use of the vacuum processing system, and more preferably the structural feature is a small variation in the structure near the edge of the lid, e g., an "S" transition between the flat o-ring sealing surface and the domed lid. Other structural variations that provide for sacrificial compliance for the purpose of preventing unwanted distortion can also be used, as will be apparent to one skilled in the art upon reading the present disclosure. This structural feature allows a single domed lid to be attached to the transfer chamber in either a convex or a concave placement without interference of the stresses of use of the chamber.

Figure 6:
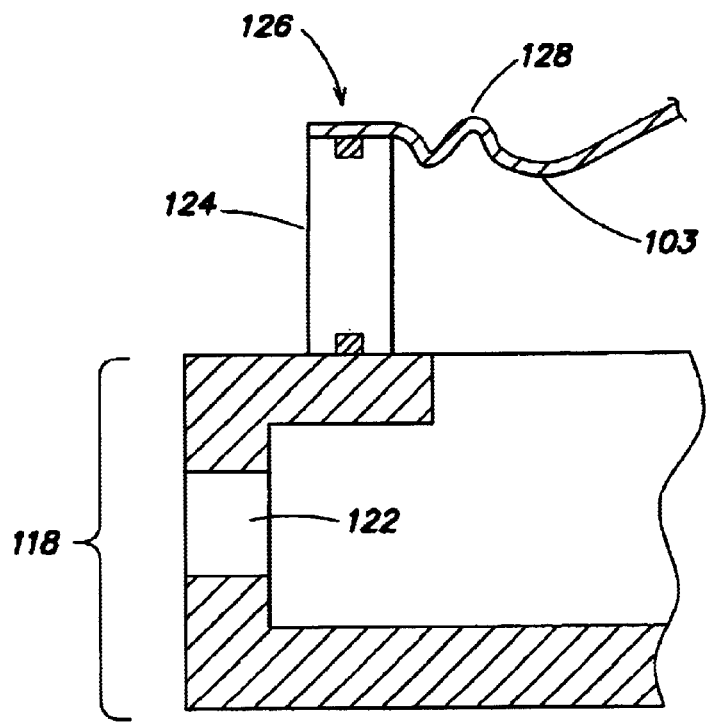
FIG. 6 is a closer view of an "S" transition of a preferred embodiment of the domed transfer chamber lid of the invention.

FIG. 6 is a close-up view of an "S" transition of a preferred embodiment of the domed transfer chamber lid of the invention. The domed lid is shown in its convex attachment placement, but the structural features such as the "S" transition are useful in either the convex or concave positions, maintaining the feature of using a single lid for both placement positions.

As well as optionally having a transfer chamber window 124 around the sides, the transfer chamber lid 103 may also contain one or more windows in the domed portion of the domed lid 103 to allow a user, diagnostic device and/or a manufacturing aid visual access to the substrate. For example, a substrate centering device 130 may visually access the substrate via one or more windows within the top of the domed lid. Preferably, the windows are provided in a symmetrical manner, i.e. evenly of the different sides of the lid, to preserve the integrity of the structure and to prevent stress due to variations in structure and/or weight.

A number of diagnostic, processing, and/or manufacturing devices may be attached to or integrated into the transfer chamber lid of the invention. For example, substrate cooling systems may be attached on the inside of a domed transfer chamber lid to allow the substrate to be cooled following processing. See e.g., U.S. Pat. No. 6,000,227 which is incorporated herein by reference. In such a configuration, the transfer chamber's robot can move a substrate out of a process chamber 104, through the slit valve door 122 and into position for cooling in the transfer chamber. In another example, a fixed sensor may be placed internally on the transfer chamber lid to determine the substrate position on the substrate support and to make appropriate corrections to the position of the substrate for loading into the process chambers.

Figure 7:
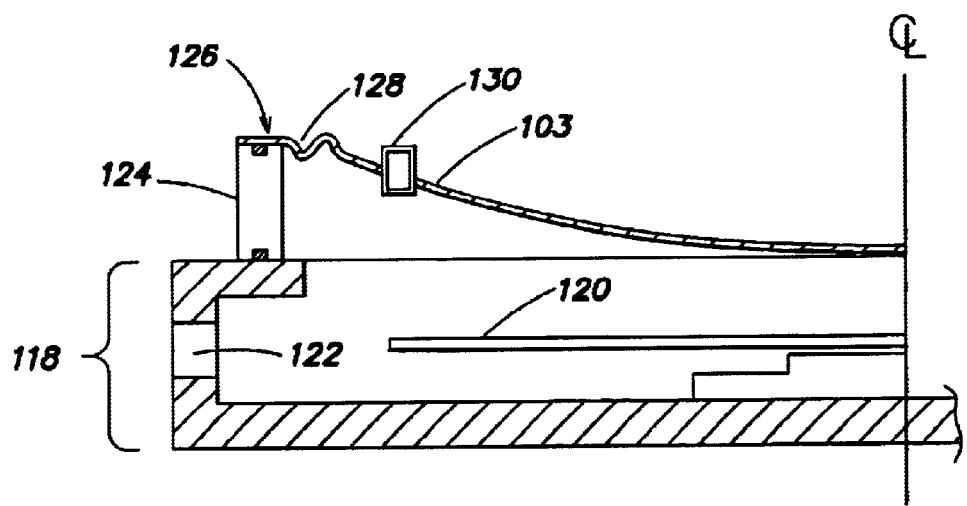
FIG. 7 is a side view of a domed transfer chamber lid having two substrate center finders.
Figure 8:
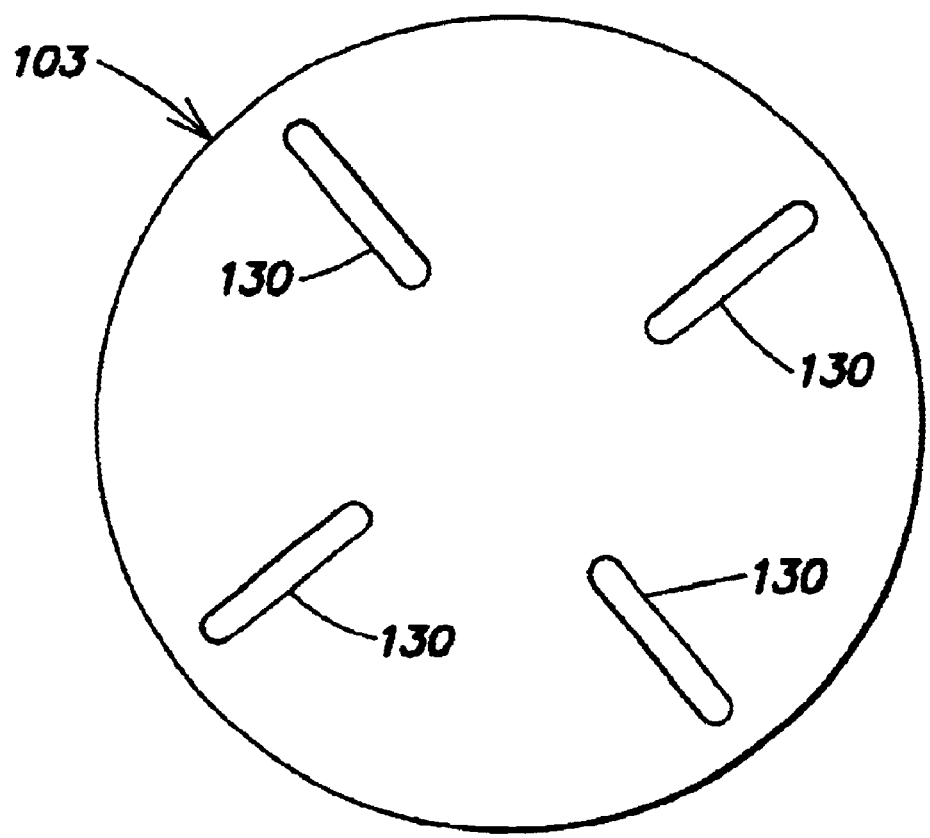
FIG. 8 is a bottom view of a domed transfer chamber lid having two substrate center finders.

FIG. 7 is a side view, and FIG. 8 a bottom view, of a domed transfer chamber lid 103 having two substrate center finders 130 integrated into the domed portion of the lid. The center finders are used as exemplary mechanisms that could be attached to or into the transfer chamber lid, as would be apparent to one in the art upon reading the instant disclosure. FIG. 7 shows the addition of a substrate center finder 130 disposed in the transfer chamber lid 103. The transfer chamber lid 103 is shown with four substrate center finders 130, which are used to determine substrate position within the system.

The windows and/or diagnostic or manufacturing devices may be placed on either the inside of the transfer chamber lid 103, or into the lid itself, as with the illustrated transfer chamber lid of FIG. 7.

Preferably, the diagnostic, processing and/or manufacturing devices arc evenly distributed on or through the lid 103 of the invention to better preserve the integrity of the transfer chamber lid 103 and to prevent stress to a particular area of the dome. For example, it is preferable to position the substrate center finders 130 symmetrically as viewed from above the lid, as illustrated in FIG. 8.

Manufacturing of the Domed Lid of the Invention

The domed transfer chamber lid of the invention may be manufactured by any number of different techniques known in the art, including but limited to hydroforming, electroplating, spinning, and combinations thereof. In a preferred embodiment, the transfer chamber lid is produced by spinning a metal, such as copper, steel, a metal clad with another metal, etc. Preferably, the lid is produced by spinning stainless steel into a domed configuration.

Other methods and materials can be used to manufacture the domed lids of the invention depending on the desired features of the particular domed lid. For instance, where strength and weight are critical, a light and strong material such as kevlar can be incorporated into the domed lid to provide extra strength without sacrificing the reduced weight of the lid. Similarly, the material used to construct the dome may be integrated with a material with properties that enhance heat resistance.

The structural features of the dome may be introduced during manufacturing, e.g., an "S" could be introduced by metal spinning during the fabrication of the spun domed lid. Structural features such as the "S" transition can also be introduced by methods such as roll forming either before of after the dome spinning.

The domed lid of the invention is less expensive to manufacture than conventional flat transfer chamber lids. The domed lid of the invention will also scale better to a larger size than the conventional flat plate lids, due to the decreased weight of the domed lids and in particular the spun domed lids. Thus, as the domed lids of the present invention will weigh less than a corresponding conventional flat plate lid of the same diameter, they are especially useful for large transfer chambers.

The structural features of the dome may be introduced during manufacturing, e.g., an "S" could be introduced by metal spinning during the fabrication of the spun domed lid. Structural features such as the "S" transition can also be introduced by methods such as roll forming either before or after the dome spinning.

Electroplating may also be used to substantially fabricate and/or to finish a domed lid of the invention. Exemplary processes that may be used are described in U.S. Pat Nos. 5,873,992 and 5,858,198, which are incorporated herein by reference. Optionally, gas shielding is employed to prevent metal plating on contacts during electroplating to reduce particulate contamination and increase thickness uniformity.

In a preferred embodiment, the domed lid of the present invention may be produced by spinning a metal plate, which may be preshaped or not. The metal is deformed on a rotating chuck by a forming roller into a hollow product with a wall thickness. Methods that may be used in the spinning of the domed lid of the present invention include U.S. Pat Nos. 5,775,151 and 5,758,532, which are incorporated herein by reference.

As it is critical to minimize contamination within the transfer chamber, the internal side of the domed lid is preferably cleaned following manufacturing (e.g., by sanding, finishing, electro-polishing, etc.) or, in the case its desirable to use the lid for both convex and concave placement, sanding or finishing both sides of the dome. An exemplary electro-polishing process that may be used to finish the domed lid of the invention is described in U.S. Pat No. 4,330,381. This processing step after manufacture of the lid removes contaminating particles that are undesirable in the sterile environment of the transfer chamber of a vacuum processing system and can provide a smooth surface of the domed lid for ease of handling and use. Where only one placement of the lid is envisioned, the domed lid can be spun so that the finished surface is internal to the transfer chamber.

As it is critical to minimize contamination with the transfer chamber, the internal side of the domed lid i. preferably cleaned following manufacturing (e.g., by sanding, finishing, electro-polishing, etc.) or, in the ca it is desirable to use the lid for both convex and concave placement, sanding or finishing both sides of the dome. A exemplary electro-polishing process that may be used to finish the domed lid of the invention is described in U.S. Pat. No. 4,330,381. This processing step after manufactur of the lid removes contaminating particles that are undesirable in the sterile environment of the transfer chamber of a vacuum processing system and can provide a smooth surface of the domed lid for ease of handling and use. Where only one placement of the lid is envisioned, the domed lid can be spun so that the finished surface is internal to the transfer chamber.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A vacuum processing system, comprising:
   a transfer chamber;
   a lid mounted on the transfer chamber wherein the lid has a curved configuration such that an edge of the lid is sealed to an edge of the transfer chamber and the lid is curved such that a center of the lid gradually increases its distance both horizontally and vertically from the edge of the transfer chamber; and
   a transparent window element positioned between the edge of the lid and the edge of the transfer chamber.

2. The vacuum processing system of claim 1 wherein the transfer chamber is circular.

3. The vacuum processing system of claim 1, wherein the transfer chamber is adapted to couple to and be selectively sealed from at least one processing chamber and at least one load lock chamber and to house at least an end effector of a robot adapted to transport a substrate between the at least one processing chamber and the at least one load lock chamber.

4. The vacuum processing system of claim 1, wherein the lid has a convex configuration such that the lid center is vertically closer to an inside area of the transfer chamber as compared to an edge of the lid.

5. The vacuum processing system of claim 1, wherein the lid has a concave configuration such that the lid center is vertically further from an inside area of the transfer chamber as compared to an edge of the lid.

6. The vacuum processing system of claim 1, wherein the lid comprises a plurality of windows positioned within the curved configuration of the lid.

7. The vacuum processing system of claim 1, wherein the lid is comprised of a metal selected from the group consisting of copper, aluminum, and steel.

8. The vacuum processing system of claim 1, wherein the lid is comprised of stainless steel.

9. The vacuum processing system of claim 8, wherein the lid is constructed by spinning.

10. The vacuum processing system of claim 9, wherein the lid is electro-polished following spinning.

11. The vacuum processing system of claim 1, wherein the lid further comprises a structural feature for absorbing stress to the lid.

12. The vacuum processing System of claim 11, wherein the structural feature is an "S" transition.

13. The vacuum processing system of claim 1, the lid further comprises one or more diagnostic devices.

14. The vacuum processing system of claim 1, lid further comprises one or more processing.

* * * * *